United States Patent [19]

Coppock

[11] 4,005,275
[45] Jan. 25, 1977

[54] WIDEBAND ANALOG PHOTORECORDING APPARATUS AND METHOD

[75] Inventor: Richard A. Coppock, San Jose, Calif.

[73] Assignee: GTE Sylvania Incorporated, Mountain View, Calif.

[22] Filed: Oct. 20, 1975

[21] Appl. No.: 623,797

Related U.S. Application Data

[63] Continuation-in-part of Ser. No. 528,807, Dec. 2, 1974, abandoned.

[52] U.S. Cl. .................. 179/100.3 G; 340/173 LT; 358/130
[51] Int. Cl.² .................... G11B 7/00; G02B 21/18; G11C 13/04
[58] Field of Search ............ 179/100.3 G; 346/108; 340/173 LM; 178/7.6, 6.6 R, 6.7 A; 350/3.5, 161

[56] References Cited
UNITED STATES PATENTS

| | | | |
|---|---|---|---|
| 2,345,441 | 3/1944 | Willard | 179/100.3 |
| 3,055,258 | 9/1962 | Hurvitz | 346/108 |
| 3,324,478 | 6/1967 | Jacobs | 346/108 |
| 3,678,472 | 7/1972 | Bass et al. | 179/100.3 G |
| 3,754,142 | 8/1973 | Angelbeck | 350/161 |

Primary Examiner—Daryl W. Cook
Attorney, Agent, or Firm—John F. Lawler

[57] ABSTRACT

A wideband analog photorecorder comprises a transparent Bragg cell as an acousto-optic transducer and a pulsed laser positioned to sequentially illuminate a moving recording medium (photographic film) through the cell. The acousto-optic cell is energized by an input electrical signal and the resultant acoustical wave passing through the cell diffracts the "strobelike" output beam from the laser so as to expose the film one line at a time with the optical analog of the signal. The pulse repetition frequency of the laser is synchronized with the velocity of acoustic wave propagation in the Bragg cell so as to expose a new signal segment in the cell with each laser pulse and thereby form one recorded line on the film. The Bragg cell utilizes an optically transparent medium, such as lithium niobate, as an acoustic wave carrier to provide optical resolution through diffraction of the laser beam. This invention may be practiced utilizing either anisotropic or normal Bragg diffraction, with or without acoustic beam steering.

The method of this invention comprises converting the amplitude modulated signal of interest to an acoustic wave, causing the acoustic wave to propagate through a Bragg cell, passing a pulsed laser output beam through an active region constituting a substantial part of the length of the Bragg cell so as to diffract the beam in accordance with the acoustic signal, and optically recording the diffracted laser beam on a moving film so that one line of data is recorded on the film each time the laser is turned on in the manner of a strobe light.

7 Claims, 3 Drawing Figures

WIDEBAND ANALOG PHOTORECORDING APPARATUS AND METHOD

BACKGROUND OF THE INVENTION

The invention described herein was made under a contract with the Department of the Navy.

This is a continuation-in-part of Ser. No. 528,807 filed Dec. 2, 1974, now abandoned.

This invention relates to optical recording apparatus and method and more particularly to an improved broadband high resolution linear analog recorder and recording method.

There are a number of applications requiring real time recording of electrical signals for storage and/or subsequent processing wherein the received information is required to be recorded at increasingly higher rates. Examples of such applications are radar and communications signals, both cooperative and non-cooperative. Prior art apparatus and techniques have employed a scanning laser beam or electron beam to expose photographic film and are limited in practice to a single-channel signal bandwidth of approximately 100 MHz. The class of problems to which this invention is directed requires substantially greater recording bandwidths, i.e., in the order of 1 GHz. These problems can be partially solved by use of multiple channel recorders with each channel covering a portion of the recording bandwidth. The complexity, cost and size of such recorder systems, however, are unacceptably high.

OBJECTS AND SUMMARY OF THE INVENTION

A general object of this invention is the provision of a single channel optical recorder having a real time recording bandwidth of approximately 1 GHz.

A further object is the provision of a broadband optical recorder having linear analog recording capability with reasonable dynamic range and amplitude linearity.

A further object is the provision of a method of optically recording signals on a film one complete line at a time and with extremely high signal resolution.

These and other objects of the invention are achieved with an optically transparent Bragg cell, means for coupling into the cell an acoustic wave analogous to the electrical signal, and a pulsed laser positioned so that its strobe-like output beam passes through part of the cell and illuminates a recording medium one line at a time with the optical equivalent of the acoustic signal. This invention comprehends both the apparatus for and method of achieving such recording.

DESCRIPTION OF PREFERRED EMBODIMENTS

Figure 1:
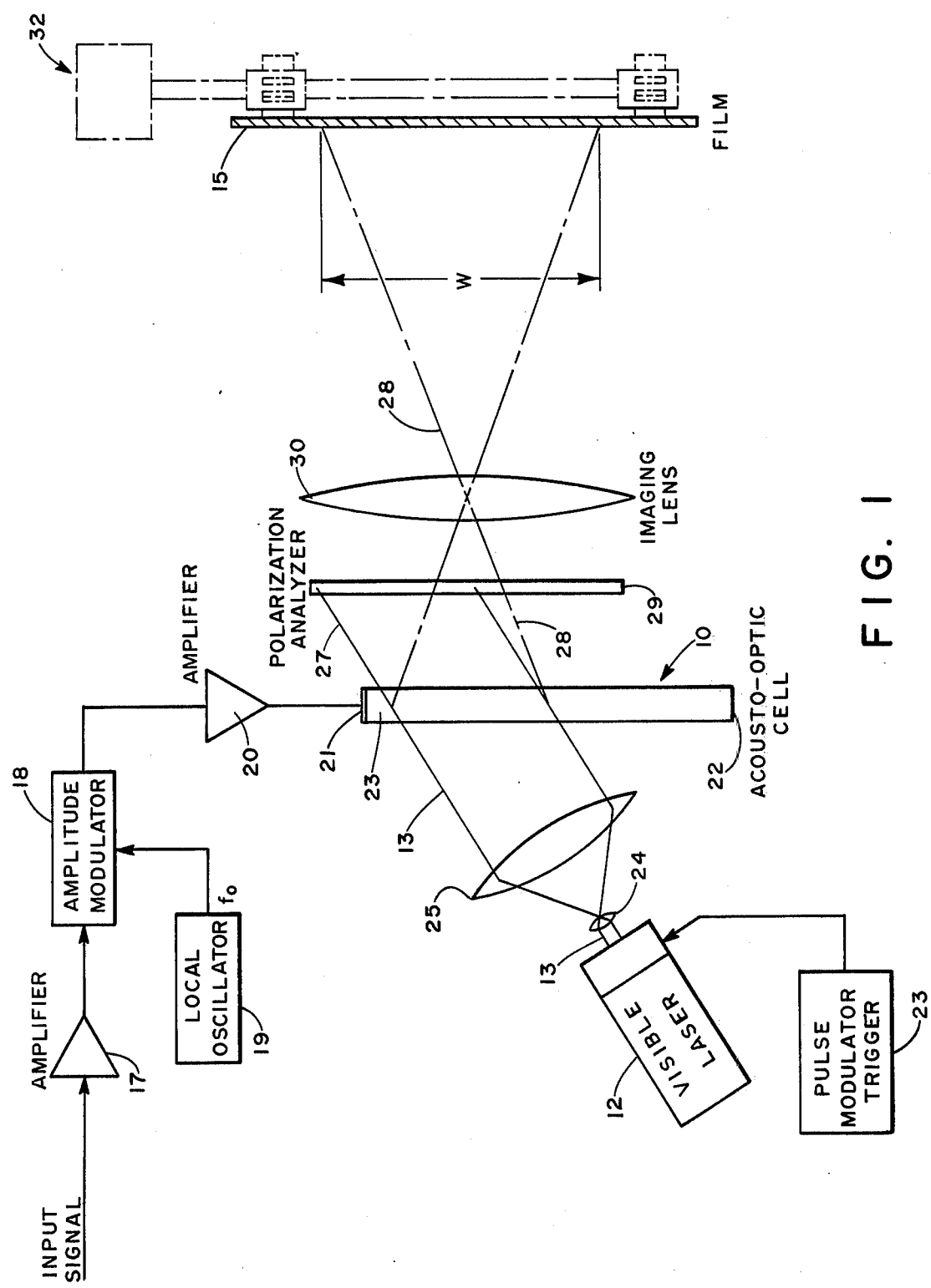
FIG. 1 is a schematic drawing of a laser recorder embodying this invention.

Referring now to the drawings, a recording system embodying the invention is illustrated in FIG. 1 and comprises a transparent acousto-optic cell 10, a laser 12 having a visible output light beam 13 which passes through cell 10, and a recording medium 15 such as photographic film which receives and records laser beam 28 (i.e., beam 13 after it has passed through and has been diffracted by cell 10). Film 15 is mounted for movement perpendicular to light beam 28 in a direction perpendicular to the plane of the paper in FIG. 1.

Cell 10 is energized by an input signal to be recorded which initially is amplified by amplifier 17 and then is applied to an amplitude modulator 18 for modulating an acoustic carrier signal output $f_o$ of local oscillator 19 connected to modulator 18. By way of example, modulator 18 may comprise a microwave diode-bridge balanced modulator. The purpose of oscillator 19 and modulator 18 is to permit photorecording of the information as density or transmittance modulating on photographic film which does not have negative values of transmittance. The unmodulated carrier signal $f_o$ exposes the film to a bias transmittance or "gray level" and signal excursions are then recorded as variations above and below this bias level as darker or lighter elements on the film.

The output of modulator 18 is amplified by amplifier 20 and the resulting signal is applied to an electro-acoustic transducer element 21 at one end of cell 10 for producing analogous acoustic waves which propagate the length of the cell. The opposite end 22 of the cell has a roughened surface which prevents reflections of the waves within the cell.

In one embodiment of the invention, cell 10 comprises a Bragg cell having an acoustic wave carrier medium 23 that is optically birefringent so as to provide anisotropic Bragg diffraction of the laser beam passing through it. A principal advantage of anisotropic Bragg diffraction in the recording system of this invention is the increased bandwidth that is obtained without acoustic beam steering.

A wave carrier or medium for the Bragg cell 10 comprises lithium niobate ($LiNbO_3$) whose low acoustic attenuation at high frequencies and large value of optical birefringence (approximately −0.08) together with good photoelastic figure of merit for anisotropic diffraction provide a maximum usable acoustic bandwidth. The typical maximum value of acoustic fractional bandwidth is 35 − 50 percent, so that the key to a large absolute signal bandwidth is a high frequency characteristic. This, in turn, is achieved by a large birefringence. The value of the center frequency for lithium niobate is 6.5 GHz, one of the highest attainable with present state of the art materials.

By way of example, a lithium niobate Bragg cell useful in an embodiment of the invention has an overall cell length of about 15 mm, an active region 6.6 mm (1 $\mu$sec.) long adjacent to the transducer end to which the input signal is coupled. The transducer element 21 is 200 $\mu$ long in the interaction direction by about 60 $\mu$ high and comprises a zinc oxide (ZnO) thin piezoelectric film.

While lithium niobate is described as one type of acoustic medium for cell 10, it will be understood that other anisotropic materials such as sapphire ($Al_2O_3$) may also be used in the practice of this invention while providing a recording bandwidth greater than in prior art systems though less than that obtainable with lithium niobate.

The acoustic signal travels through the active region of cell 10 in a predetermined time, such as 1 $\mu$sec., and in order to optically record this analog signal, laser 12 is operated to produce relatively short ($\approx$0.4 ns) output pulses at a corresponding repetition frequency. To this end, laser 12 comprises, for example, a mode-locked, cavity dumped laser, such as an Argon ion laser with an output wavelength of 0.5145 $\mu$; this laser is triggered by a pulse modulator trigger 23 so as to produce very short ($\approx$0.4 ns) pulses at a repetition frequency corresponding to the time required for an acoustic signal to traverse the interaction region of the cell. For example, for a 6 mm interaction region in lithium niobate, a pulse repetition frequency of 1 MHz is employed. The laser output beam 13 is expanded by lenses 24 and 25 so as to pass through the active region of the cell as shown. Thus each laser pulse illuminates a substantial length of the cell medium and essentially "freezes" the travelling acoustical signal for optical recording. Successive output pulses record contiguous intervals of acoustic signal on the continuously moving recording medium 15 and because of the narrow pulse width do so without smearing. The signal is recorded as a continuous, intensity-modulated raster. A continuous signal stream of $10^{10}$ bits or more is recordable, using a commercial instrumentation camera. The signal is recoverable either by photoelectric scanning or coherent optical data processing.

Figure 2:
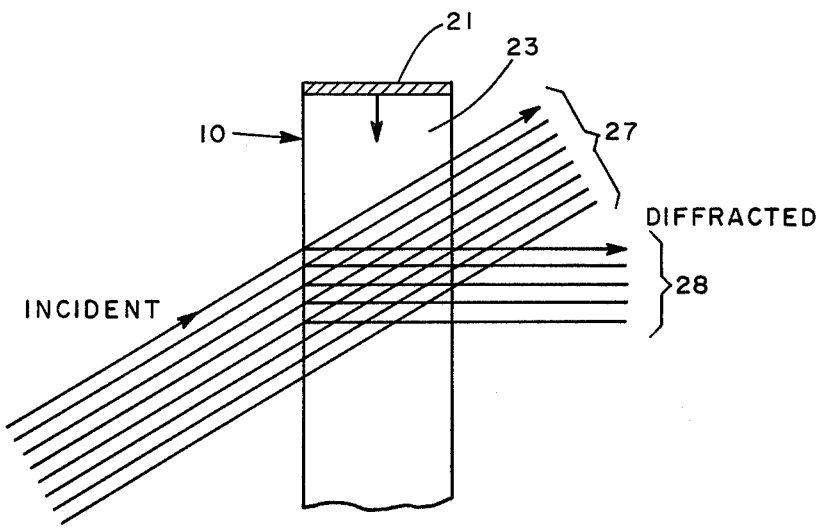
FIG. 2 is a schematic drawing of the Bragg cell illustrating its effect in diffracting incident light from the laser.

The diffracted light beam 28, see FIG. 2, from the anisotropic Bragg cell is polarization rotates 90° from the undiffracted light 27. This aspect of system operation provides an additional advantage of increased discrimination against unwanted light by means of a polarization analyzer 29 on the optical output side of cell 10 and which passes only diffracted signal light to the film and blocks the rest.

In the absence of a signal, the unmodulated acoustic carrier signal $f_o$ diffracts a uniformly intense line which coincides in location with the "exit" face of the acoustic-optic interaction region of the cell. When the carrier is amplitude modulated by the electrical input signal, this line will contain corresponding spatial variations in brightness, and thus constitutes an optical replica of the electrical input signal.

Figure 3:
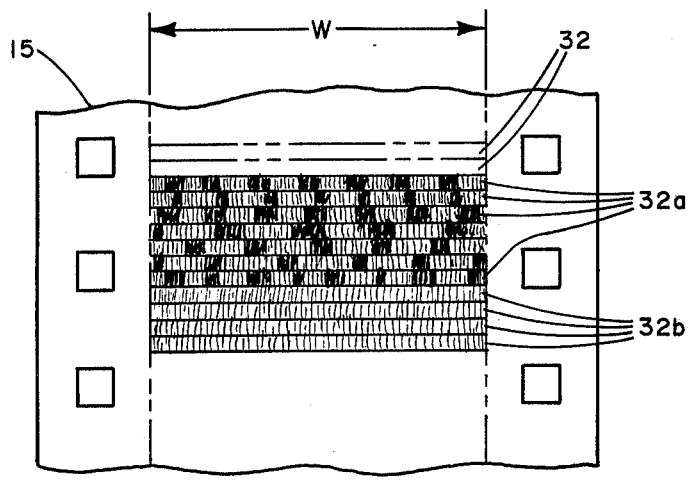
FIG. 3 is a schematic plan view of a strip of photographic recording film showing sequentially recorded lines of information produced by successive pulses of the laser light passing through the Bragg cell.

Lens 30 focuses signal light on a photographic film strip 15, see FIG. 3, driven by a suitable drive means shown in broken line at 31 at a constant velocity transversely of signal light beam 28 into plane of sketch as shown in FIG. 1. Each laser pulse exposes one line 32 of width W corresponding to the length of the cell interaction region so that a plurality of such exposed lines appear in immediate succession on the film as shown. When carrier signal $f_o$ is modulated with an input signal, the recorded lines 32a have variations of light intensity as indicated in the upper part of the film strip in FIG. 3; when no input signal is applied, the recorded lines 32b have a uniform light intensity as shown in the lower part of the film strip. In order to insure that the film will record all information contained in the input signal, a minor degree of overlap of information on successive lines is provided and this is taken into account by simple masking when later processing the information.

It should be understood that the analog recorder described above is inherently capable of recording digital input signals whereas the converse generally is not true, i.e., a digital recorder may not be capable of recording an analog signal.

An alternate embodiment of the invention utilizes normal Bragg diffraction in optical cell material which need not be birefringent. A representative material of this type which has desirable properties for use in this invention and which is not birefringent is bizmuth germanium oxide ($Bi_{12}GeO_{20}$). For very high frequency applications, however, representative materials may include titanium oxide ($TiO_2$), lithium tantalate ($LiTaO_3$), and lithium niobate. The birefringent properties of these latter materials are coincidental and are not utilized.

A further modified form of the invention utilizing normal Bragg diffraction incorporates acoustic beam steering described in detail in an article entitled "Wide-Band Acoustooptic Deflectors Using Acoustic Beam Steering" by G. A. Coquin et al., IEEE Transactions on Sonics and Ultrasonics, Vol. SU-17, No. 1., January 1970, pages 34–40. Acoustic beam steering which involves varying the acoustic beam direction with frequency to maintain substantially constant the Bragg angle is typically employed to achieve efficient wide-band normal Bragg diffraction.

This invention also comprehends the method of broadband photorecording of electrical signals consisting of the steps of converting the electrical input signal into an acoustical signal and propagating same through a transparent acoustooptic cell, directing the visible output beam of a pulsed laser through the cell transversely of the direction of acoustical wave propagation so that the beam is diffracted in accordance with the information on the acoustical wave, and recording on a photosensitive medium the diffracted portions of the beam one line at a time, with each laser pulse, intensity variations corresponding to the input signal. The beam may be subjected to either anisotropic or normal Bragg diffraction. Also, beam steering may be used with normal Bragg diffraction to extend the operating bandwidth of the system.

What is claimed is:

1. A system for real time recording of an electrical signal comprising an elongated acousto-optic cell having a transparent body and a transducer for converting said electrical signal into sound waves, said transducer being coupled to said body whereby sound waves corresponding to said electrical signal propagate through the latter for the length of the cell, a laser having an output beam, means for causing said laser to produce said beam in short pulses at a predetermined pulse repetition frequency, said laser and said cell being relatively positioned so that said pulsed output beam passes through a predetermined length of said cell body and emerges therefrom as diffracted and undiffracted beams, the period of said laser beam pulses being substantially the same as the transit time of said sound waves through said predetermined length of the cell body whereby successive pulses illuminate contiguous intervals of the acoustic signal propagating through said cell, an optical recording medium disposed in a plane transversely of the direction of propagation of said diffracted beam whereby said diffracted beam is incident as a line upon said medium for each laser beam pulse, and means for moving said recording medium transversely of said diffracted beam at a velocity which causes successive light pulses to expose contiguous lines on said medium whereby the acoustical analog of said electrical signal is optically recorded as intensity variations in successive lines on said medium.

2. The system according to claim 1 with beam steering means associated with said cell.

3. A broadband system for real time recording of electrical signals comprising a Bragg cell having a transparent body, means for coupling to said body for propagation therethrough an acoustical wave corresponding to the electrical signal to be recorded, laser means having a strobe-like output beam traversing at least part of said body whereby said beam is diffracted in accordance with the acoustical wave propagating in said body, the strobe repetition frequency corresponding approximately to the reciprocal of the time required for the acoustical wave in the cell body to traverse the interaction region, and optical recording means receiving said diffracted beam and moving relative thereto whereby said strobe-like diffraction beam exposes said medium one line at a time to produce a succession of such lines.

4. The system according to claim 3 with a local oscillator having an output having a carrier frequency, means for amplitude modulating said oscillator output with said signal to be recorded, and means for applying the output of said modulating means to an electroacoustic transducer on said Bragg cell.

5. A method of real time recording of electrical signals consisting of the steps of converting the electrical signal into an analogous acoustic wave in a transparent Bragg cell, generating an intermittently pulsed laser beam, directing said intermittently pulsed laser beam through said cell in a direction transversely of the direction of acoustic wave propagation therein to produce a pulsed output diffracted light beam, and moving an optical recording medium transversely of said output beam so as to intercept and record same in successive lines at the rate of one line for each laser beam pulse.

6. The method of claim 5, with said recording medium comprising photographic film, the step of modulating the output of a bias acoustic frequency oscillator with said electrical signal prior to conversion into said acoustic wave for producing a bias transmittance on said film.

7. The method according to claim 5 with the step of steering the direction of propagation of the acoustic wave through said cell so that Bragg angle geometry is maintained as frequency varies.

* * * * *